United States Patent
Ossmann et al.

(10) Patent No.: US 9,588,434 B2
(45) Date of Patent: *Mar. 7, 2017

(54) CATOPTRIC ILLUMINATION SYSTEM FOR MICROLITHOGRAPHY TOOL

(75) Inventors: Jens Ossmann, Aalen (DE); Martin Endres, Koenigsbronn (DE); Ralf Stuetzle, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 835 days.

This patent is subject to a terminal disclaimer.

(21) Appl. No.: 13/562,515

(22) Filed: Jul. 31, 2012

(65) Prior Publication Data

US 2012/0300185 A1    Nov. 29, 2012

Related U.S. Application Data

(63) Continuation of application No. 12/533,513, filed on Jul. 31, 2009, now Pat. No. 8,253,925, which is a continuation of application No. PCT/IB2007/003547, filed on Jun. 7, 2007.

(51) Int. Cl.
*G03B 27/54* (2006.01)
*G03F 7/20* (2006.01)

(52) U.S. Cl.
CPC .......... *G03F 7/702* (2013.01); *G03F 7/70075* (2013.01); *G03F 7/70083* (2013.01)

(58) Field of Classification Search
CPC ... G03F 7/70075; G03F 7/70083; G03F 7/702
USPC ................................. 355/53, 67, 71; 359/618
See application file for complete search history.

(56) References Cited

U.S. PATENT DOCUMENTS

| | | | | |
|---|---|---|---|---|
| 5,098,184 A | * | 3/1992 | van den Brandt | G02B 3/00 353/102 |
| 6,195,201 B1 | * | 2/2001 | Koch | G03F 7/70075 355/67 |
| 6,438,199 B1 | | 8/2002 | Schultz et al. | |
| 6,859,328 B2 | | 2/2005 | Schultz et al. | |
| 8,253,925 B2 | | 8/2012 | Ossmann et al. | |
| 2002/0136351 A1 | * | 9/2002 | Singer | B82Y 10/00 378/34 |

(Continued)

FOREIGN PATENT DOCUMENTS

| EP | 1 540 423 | 6/2005 |
|---|---|---|
| EP | 1540423 | 6/2005 |

(Continued)

OTHER PUBLICATIONS

Taiwanese Office Action, with translation thereof, for corresponding TW Appl No. 97112911, dated Sep. 10, 2010.

(Continued)

*Primary Examiner* — Deoram Persaud
(74) *Attorney, Agent, or Firm* — Fish & Richardson P.C.

(57) ABSTRACT

In general, in one aspect, the invention features a system that includes an illumination system of a microlithography tool, the illumination system including a first component having a plurality of elements. During operation of the system, the elements direct radiation from a source along an optical path to an arc-shaped object field at an object plane of a projection objective, and at least one of the elements has a curved shape that is different from the arc-shape of the object field.

25 Claims, 6 Drawing Sheets

(56) References Cited

U.S. PATENT DOCUMENTS

| | | | |
|---|---|---|---|
| 2002/0191170 A1 | 12/2002 | Komatsuda | |
| 2003/0002022 A1* | 1/2003 | Schultz | G02B 17/0621 355/67 |
| 2003/0095622 A1* | 5/2003 | Schultz | B82Y 10/00 378/34 |
| 2003/0227603 A1* | 12/2003 | Dierichs | G03F 7/70091 355/47 |
| 2004/0037388 A1* | 2/2004 | Antoni | B82Y 10/00 378/34 |
| 2004/0061917 A1* | 4/2004 | Mushika | G02B 3/0043 359/295 |
| 2005/0110972 A1 | 5/2005 | Tsuji et al. | |
| 2005/0264867 A1* | 12/2005 | Cho | G02B 5/09 359/291 |
| 2005/0270513 A1* | 12/2005 | Dierichs | G03F 7/70075 355/67 |
| 2006/0028709 A1* | 2/2006 | Cho | G09G 3/346 359/291 |
| 2006/0175556 A1 | 8/2006 | Yabuki | |
| 2006/0208206 A1* | 9/2006 | Hainz | G03F 7/70083 250/493.1 |
| 2007/0041077 A1* | 2/2007 | Seo | H04N 5/7458 359/291 |
| 2007/0132977 A1* | 6/2007 | Komatsuda | G02B 17/0663 355/60 |
| 2007/0273859 A1* | 11/2007 | Komatsuda | G03F 7/70075 355/67 |
| 2008/0278704 A1* | 11/2008 | Endres | G03F 7/70108 355/67 |
| 2009/0040493 A1* | 2/2009 | Komatsuda | G03F 7/702 355/67 |
| 2009/0257040 A1* | 10/2009 | Dinger | G02B 27/0905 355/70 |
| 2009/0323044 A1 | 12/2009 | Ossmann et al. | |

FOREIGN PATENT DOCUMENTS

| | | |
|---|---|---|
| EP | 1 291 721 | 3/2006 |
| EP | 1 811 547 A | 7/2007 |
| EP | 1291721 | 2/2008 |
| JP | 62 002540 | 1/1987 |
| JP | S 62-2540 A | 1/1987 |
| JP | 2002-343695 | 11/2002 |
| JP | 2006-216917 | 8/2006 |
| WO | WO 2004/021086 | 3/2004 |
| WO | WO 2006/082738 | 8/2006 |

OTHER PUBLICATIONS

Korean Office Action, with translation thereof, for corresponding KR Appl No. 10-2009-7023011, dated Jan. 25, 2014.
European Office Action, for the corresponding EP Application No. EP 07 848 908.5, dated Apr. 8, 2010.
Korean Office Action with translation thereof, for corresponding KR Appl No. 2009-7023011, mailed on Jul. 24, 2013.
European Office Action, for corresponding EP Appl No. 07 848 908.5, dated Apr. 8, 2010.
European Office Action, for corresponding EP Appl No. 07 848 908.5, dated Oct. 13, 2011.
Japanese Office Action, with translation thereof, for corresponding JP Appl No. 2010-510893, dated Nov. 23, 2011.
Office Action, for corresponding US Publication No. 20090323044, dated Jan. 25, 2012.
The International Search Report and Written Opinion for corresponding PCT Appl No. PCT/IB2007/003547, dated Jul. 16, 2008.

* cited by examiner

CATOPTRIC ILLUMINATION SYSTEM FOR MICROLITHOGRAPHY TOOL

CROSS-REFERENCE TO RELATED APPLICATIONS

This application is a continuation of, and claims benefit under 35 USC 120 to, U.S. application Ser. No. 12/533,513, filed Jul. 31, 2009, now U.S. Pat. No. 8,253,925, which is a continuation of, and claims benefit under 35 USC 120 to, international application PCT/IB2007/003547, filed Jun. 7, 2007. U.S. application Ser. No. 12/533,513 and international application PCT/IB2007/003547 are hereby incorporated by reference in their entirety.

TECHNICAL FIELD

This disclosure relates to catoptric illumination systems and to tools that use catoptric illumination systems.

BACKGROUND

Illumination systems are widely used in microlithography to illuminate a reticle with radiation having a desired homogeneity and pupil fill. A projection objective is then used to transfer a pattern from a reticle to a substrate by forming an image of the reticle on a layer of a photosensitive material disposed on the substrate. In general, illumination systems fall into three different classes: dioptric systems; catoptric systems; and catadioptric systems. Dioptric systems use exclusively refractive elements (e.g., lens elements) to shape radiation from a source to have desired properties at an object plane of the projection objective. Catoptric systems use exclusively reflective elements (e.g., mirror elements) to shape the radiation. Catadioptric systems use both refractive and reflective elements to shape the radiation.

SUMMARY

Catoptric illumination systems for microlithography tools are disclosed. In certain embodiments, these illumination systems include a faceted reflector, referred to as a field raster plate, where the shape of each reflector facet (referred to as a field facet element) is selected to provide efficient illumination of the field at the object plane of the microlithography tool's projection objective. The shape of the field facet elements are distorted relative to the field shape in a manner that compensates for projection effects introduced by the catoptric illumination system. For example, curve-shaped field facet elements (e.g., arc-shaped field facet elements) can be used to illuminate an arc-shaped field, where the proportions of the field facet elements are different from the proportions of the arc-shaped field. A curve-shaped element or field refers to an element or field which has at least two opposing edges which are nominally not straight lines. An example of a curve-shaped element/field is an arc-shaped element/field, which has two opposing edges that are curved in the same direction with no points of inflection. An example of an arc-shaped element/field is an element/field that has the shape of a segment of an annulus. In other words, the two opposing edges are both arc-shaped, each have a different constant radius of curvature and are arranged concentrically. Various aspects of the invention are summarized below.

In general, in one aspect, the invention features a system that includes an illumination system of a microlithography tool, the illumination system including a first component having a plurality of elements. During operation of the system, the elements direct radiation from a source along an optical path to an arc-shaped object field at an object plane of a projection objective, and at least one of the elements has a curved shape that is different from the arc-shape of the object field.

In general, in another aspect, the invention features a system that includes an illumination system of a microlithography tool, the illumination system including a first component having a plurality of elements. During operation of the system, the elements direct radiation from a source along an optical path to an arc-shaped object field at an object plane of a projection objective, and at least one of the elements has a curved shape and the illumination system is configured to image the curve-shaped element to the object plane, where the shape of the image of the curve-shaped element at the object plane is the same as the shape of the object field.

In general, in a further aspect, the invention features a system that includes an illumination system of a microlithography tool, the illumination system including a first component having a plurality of elements and a second component having a plurality of elements. During operation of the system, the elements of the first component reflect radiation from a source along an optical path to the elements of the second component, the elements of the second component reflect the radiation to an object field at an object plane of a projection objective, the object field having a first shape, at least one of the elements of the first component has a second shape different from the first shape, and there are no reflective components in the optical path between the second component and the object plane.

In a further aspect, the invention features a method that includes directing radiation from a component having a plurality of reflective elements to an arc-shaped object field at an object plane of a microlithography projection objective. At least one of the elements has a curved shape that is different from the arc-shape of the object field.

In general, in a further aspect, the invention features a method that includes imaging a plurality of curve-shaped reflective elements to an arc-shaped object field at an object plane of a microlithography projection objective. The images of the reflective elements at the object plane have the same size and shape as the arc-shape of the object field.

Embodiments of the systems and methods can include one or more of the following features. For example, the elements can be reflective elements. The first component can support the plurality of reflective elements. The first component can be a field raster plate.

In some embodiments, the illumination system is configured to image each element of the first component to the object plane. The shape of each image of each element at the object plane can be distorted relative to the shape of the element. The shape of each image of each element at the object plane can be the same as the shape of the object field. The image of each element can overlap at the arc-shaped object field such that the images fill the arc shaped object field. The shape of each element can be selected so that an energy profile of the radiation at the object field has a substantially Gaussian or trapezoidal shape along at least one direction. The direction can correspond to a scan direction of a reticle positioned at the object plane during operation of the microlithography tool.

The image of each element can be a magnified image.

Each element of the first component can have the same shape. Alternatively, at least some of the elements of the first component have different shapes. In some embodiments, all of the elements of the first component have curved shape that is different from the shape of the object field. At least one pair of elements of the first component can have adjacent edges that have the same shape. The first component can include a plurality of groups of elements, where the adjacent edges of each pair of elements in each group has the same shape. The adjacent edges are circular edges having the same radius of curvature. At least one curve-shaped element can be an arc-shaped element.

In some embodiments, the at least one curve-shaped element of the first component is shaped as a segment of an annulus and has an inner edge with a constant radius of curvature, IR, and a width, w, and the arc-shaped object field is shaped as a segment of an annulus and has an inner edge with a constant radius of curvature, $IR_f$, and a width, $w_f$, and the ratio IR/w is different from the ratio $IR_f/w_f$. In some embodiments, IR/w<$IR_f/w_f$. In certain embodiments, IR/w>$IR_f/w_f$.

In some embodiments, the at least one curve-shaped element of the first component is shaped as a segment of an annulus and has an inner edge with a constant radius of curvature, IR, and a height, h, and the arc-shaped object field is shaped as a segment of an annulus and has an inner edge with a constant radius of curvature, $IR_f$, and a height, $h_f$, and the ratio IR/h is different from the ratio $IR_f/h_f$. In some embodiments, IR/h<$IR_f/h_f$. In certain embodiments, IR/h>$IR_f/h_f$.

In some embodiments, the at least one curve-shaped element of the first component is shaped as a segment of an annulus and has a height, h, and a width, w, and the arc-shaped object field is shaped as a segment of an annulus and has a height, $h_f$, and a width, $w_f$, and the ratio h/w is different from the ratio $h_f/w_f$. In some embodiments, h/w<$h_f/w_f$. In certain embodiments, h/w>$h_f/w_f$.

The system can further include a second component configured to direct illumination reflected from the elements of the first component along the optical path to the object plane. The second component can include a plurality of elements each configured to reflect illumination reflected from the elements of the first component along the optical path to the object plane. The illumination system can be configured to image the source to each element of the second component. The plurality of elements of the second component can be configured to provide a desired pupil fill of an exit pupil of the illumination system. The desired pupil fill can correspond to circular, annular, dipole, or quadrapole illumination. The second component can be a pupil raster plate. There can be no additional reflective elements in the optical path between the second component and the object plane. The system can include at least one additional reflective element in the optical path. The at least one additional reflective element can be a grazing incidence mirror. The at least one additional reflective element can be a normal incidence mirror. The illumination system can be a catoptric illumination system. The source can be configured to provide radiation at a wavelength λ to the illumination system, where λ is about 193 nm or less. In some embodiments, λ is about 13 nm.

In another aspect, the invention features an EUV microlithography tool that include the systems discussed above or that is configured to implement the methods discussed above.

Embodiments include illumination systems for EUV lithography tools that provide illumination to a reticle with a relatively high degree of homogeneity across an object field. For example, embodiments include a field raster plate composed of a faceted mirror where each facet is imaged to the object plane. The facets are designed so that the size and shape of their image at the object plane matches the size and shape of the object field. Moreover, the illumination system is arranged so that all the mirror facet images overlap at the object field.

The illumination systems can provide illumination to a reticle plane in a manner such that the intensity distribution over the exposure field at the projection objective image plane is substantially the same over the entire scan range.

In certain embodiments, the shape of the mirror facets is chosen such that the shapes of their images at the object plane do not identically match the shape of the object field, but rather provide an intensity profile at the object field that has a certain shape along at least one direction (e.g., the scan direction of the reticle in the case of a scanner). For example, the intensity profile can have a substantially Gaussian or substantially trapezoidal profile along at least one direction at the object plane. Furthermore, in some embodiments, the intensity profile at the object field can have the same shape across one dimension. For example, the intensity profile, as measured along a first direction (e.g., the scan direction in a scanner) can be substantially the same for all locations orthogonal to the first direction. By choosing the shape of the mirror facets, a variety of profiles in the scanning direction can be achieved.

Embodiments include catoptric illumination systems with relatively few reflective elements. For example, certain embodiments include a collector, a field raster plate, and a pupil raster plate. Some embodiments include no additional reflective elements between the pupil raster plate and the reticle. For example, an additional field-forming mirror between the pupil raster plate and the reticle may not be necessary. Alternatively, or additionally, in certain embodiments no additional reflective elements are positioned in the optical path between the collector and the field raster plate. As a result of the relatively few reflective elements, catoptric illumination systems with relatively high transmission efficiency may be realized.

The details of one or more embodiments are set forth in the accompanying drawings and the description below. Other features and advantages will be apparent from the description and drawings, and from the claims.

DESCRIPTION OF DRAWINGS

Like reference symbols in the various drawings indicate like elements.

DETAILED DESCRIPTION

Figure 1:
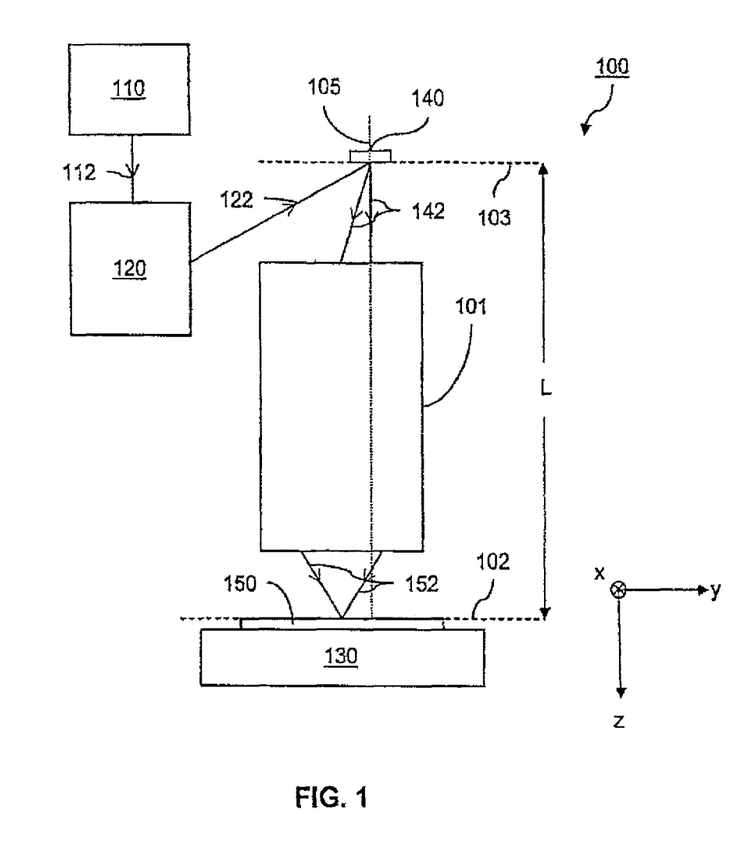
FIG. 1 is a schematic diagram of a microlithography tool.

Referring to FIG. 1, a microlithography tool 100 generally includes a light source 110, an illumination system 120, a projection objective 101, and a stage 130. A Cartesian co-ordinate system is shown for reference. Light source 110 produces radiation 112 at a wavelength λ which is collected by illumination system 120. Illumination system 120 interacts with (e.g., expands and homogenizes) the radiation and directs shaped radiation 122 to a reticle 140 positioned at an object plane 103. Projection objective 101 images radiation 142 reflected from reticle 140 onto a light sensitive layer (e.g., a resist) on a substrate 150 positioned at an image plane 102 of projection objective 101. The radiation on the image-side of projection objective 101 is depicted as rays 152. As shown in FIG. 1, the rays are illustrative only and not intended to be accurately depict the path of the radiation with respect to reticle 140, for example. Substrate 150 is supported by stage 130, which moves substrate 150 relative to projection objective 101 so that projection objective 101 images reticle 140 to different portions of substrate 150. In embodiments where lithography tool 100 is a scanner, the tool includes a reticle stage that moves reticle 140 in a scan direction with respect to illumination system 120.

Projection objective 101 includes a reference axis 105 (e.g., an optical axis). In embodiments where projection objective is symmetric with respect to a meridional section, reference axis 105 is perpendicular to object plane 103 and passes through the center of the object field. In certain embodiments, axis 105 intersects both the object field and the image field of projection objective 101. In some embodiments, both an object field and an image field of projection objective 101 are not intersected by axis 105.

Light source 110 is selected to provide radiation at a desired operational wavelength, $\lambda$, of tool 100. In some embodiments, light source 110 is a laser light source, such as a KrF laser (e.g., having a wavelength of about 248 nm) or an ArF laser (e.g., having a wavelength of about 193 nm). Non-laser light sources that can be used include light-emitting diodes (LEDs), such as LEDs that emit radiation in the blue or UV portions of the electromagnetic spectrum, e.g., about 365 nm, about 280 nm or about 227 nm.

Typically, for projection objectives designed for operation in lithography tools, wavelength $\lambda$ is in the ultraviolet portion of the electromagnetic spectrum. For example, $\lambda$ can be about 400 nm or less (e.g., about 300 nm or less, about 200 nm or less, about 100 nm or less, about 50 nm or less, about 30 nm or less). $\lambda$ can be more than about 2 nm (e.g., about 5 nm or more, about 10 nm or more). In embodiments, can be about 193 nm, about 157 nm, about 13 nm, or about 11 nm. Wavelengths in the 1 nm to 100 nm range (e.g., 13 nm) are referred to as Extreme UV ("EUV"). Using a relatively short wavelength may be desirable because, in general, the resolution of a projection objective is approximately proportional to the wavelength. Therefore shorter wavelengths can allow a projection objective to resolve smaller features in an image than equivalent projection objectives that use longer wavelengths. In certain embodiments, however, $\lambda$ can be in non-UV portions of the electromagnetic spectrum (e.g., the visible portion).

Typical light sources for wavelengths between 100 nm and 200 nm are excimer lasers, for example an ArF-Laser for 193 nm, an $F_2$-Laser for 157 nm, an $Ar_2$-Laser for 126 nm and an NeF-Laser for 109 nm. Since the transmission of the optical materials deteriorates with decreasing wavelength, the illumination systems can be designed with a combination of refractive and reflective components. For wavelengths in the EUV wavelength region, such as between 10 nm and 20 nm, lithography tool 100 is designed as all-reflective. Examples of EUV light sources are a Laser-Produced-Plasma-source, a Pinch-Plasma-Source, a Wiggler-Source or an Undulator-Source.

Figure 2A:
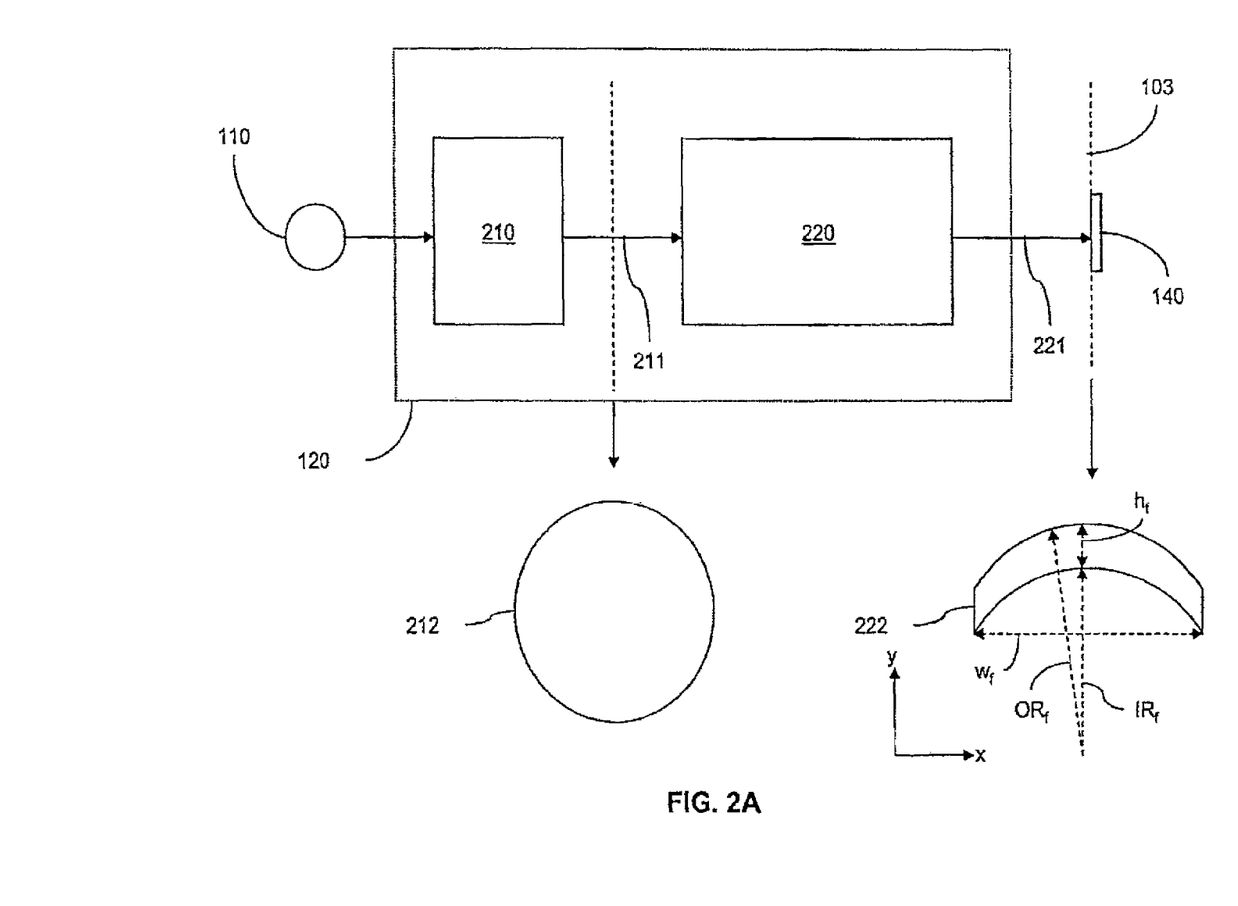
FIG. 2A is a schematic diagram of an illumination system of a microlithography tool.

Referring to FIG. 2A, illumination system 120 includes optical components arranged to form a radiation beam with a homogeneous intensity profile and desired pupil fill. Typically, illumination system 120 includes a collector 210, configured to collect radiation from source 110 and direct the radiation as a beam along an optical path to beam shaping optics 220. Typically, collector 210 will produce a collimated or convergent beam.

In general, the shape and intensity profile of the radiation exiting collector 210 different from a desired shape and intensity profile of the radiation at object plane 103. For example, the beam profile 212 between collection optics and beam shaping optics 220 is typically substantially circular in shape with an intensity profile that can vary substantially across its width.

The portion of the reticle positioned at object plane 103 that is imaged to image plane 102 is referred to as the object field. In general, the shape of the object field at object plane 103 is determined by projection objective 101. Usually, the object field corresponds to a region that is imaged to image plane 102 with relatively low aberrations. Typically, the shape of the object field is dependent on the type of projection objective 101. In stepper-type lithography tools, the object field is generally rectangular in shape. In scanner-type lithography tools, the object field is typically rectangular or arc-shaped. All reflective, or catoptric, projection objectives, for example, typically have an arc-shaped object field.

Accordingly, beam shaping optics 220 include one or more components configured to provide a beam of radiation at objection plane 103 having a desired intensity profile across the object field and a desired pupil fill. For example, in some embodiments, beam shaping optics 220 can provide a beam having a substantially homogeneous intensity profile across the object field (e.g., the radiation intensity inside the object field varies by about ±5% or less) having the same size and shape as the object field. Other profiles are also possible as discussed below.

In catoptric systems, such as in lithography tools designed for use at EUV wavelengths, an arc-shaped object field 222 is typically desired, as indicated in FIG. 2A. Arc-shaped object field 222 corresponds to a segment of an annulus which is characterized by an inner radius of curvature, $IR_f$, an outer radius of curvature, $OR_f$, and a width, $w_f$. Arc-shaped field 222 is also characterized by a height, $h_f$, which is the difference between $OR_f$ and $IR_f$. $IR_f$ and $OR_f$ are constant across the width of the field. A Cartesian coordinate system is provided for reference in object plane 103. Width, $w_f$, is measured along the x-axis, while height, $h_f$, is measured along the y-axis. In some embodiments, $IR_f$ is in a range from about 50 mm to about 250 mm (e.g., in a range from about 100 mm to about 200 mm, such as about 110 mm or more, about 120 mm, about 125 mm, about 130 mm), $w_f$ is in a range from about 50 mm to about 250 mm (e.g., in a range from about 80 mm to about 200 mm, such as about 100 mm, about 105 mm, about 110 mm), and $h_f$ is in a range from about 5 mm to about 20 mm (e.g., in a range from about 8 mm to about 15 mm, such as about 10 mm).

In embodiments with arc-shaped object fields, beam shaping optics 220 includes one or more components that direct radiation from collection optics 210 to object plane 103 in a way that provides homogeneous illumination of arc-shaped object field 222. An example of a component that can perform this function is a field raster plate, examples of which are discussed below. Moreover, beam shaping optics 210 can include one or more components configured to provide a desired fill of the exit pupil of illumination system 120, which is located at the entrance pupil of the projection objective 101. For example, beam shaping optics 210 can include one or more components that provide circular, annular, dipolar, or quadrupolar illumination at the entrance pupil of projection objective 101. An appropriate pupil raster plate can be used to perform this function.

Figure 2B:
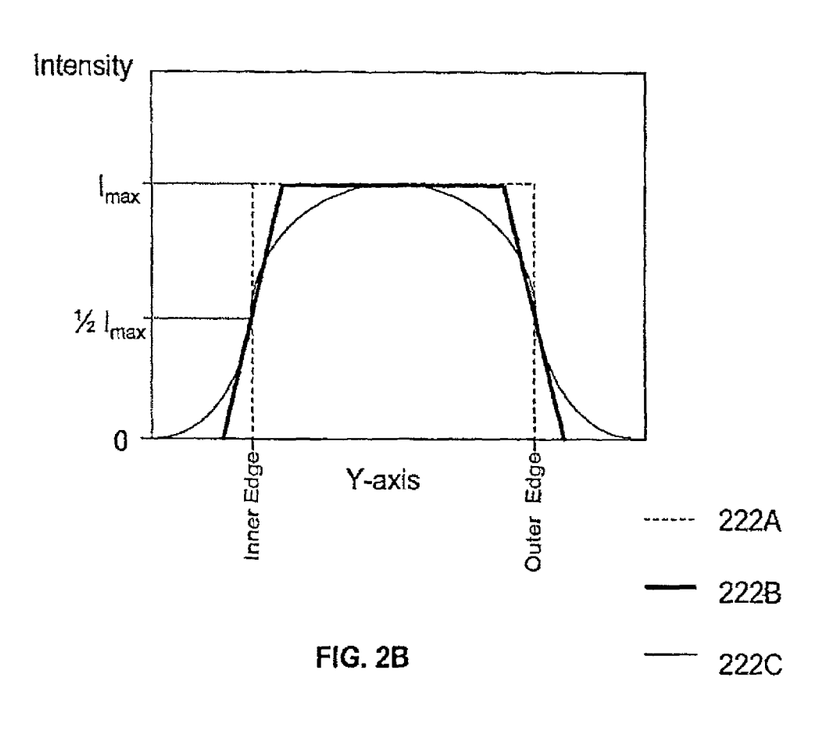
FIG. 2B shows plots of different intensity profiles through sections of an illuminated object field.

FIG. 2B shows different possible intensity profiles of the radiation at image plane 103 across a section of object field 222. In some embodiments, the radiation has a substantially step-shaped profile (curve 222A). In certain embodiments, the radiation has a substantially trapezoidal profile (curve 222B). In some embodiments, the radiation has a substantially Gaussian profile (curve 222C).

Figure 3:
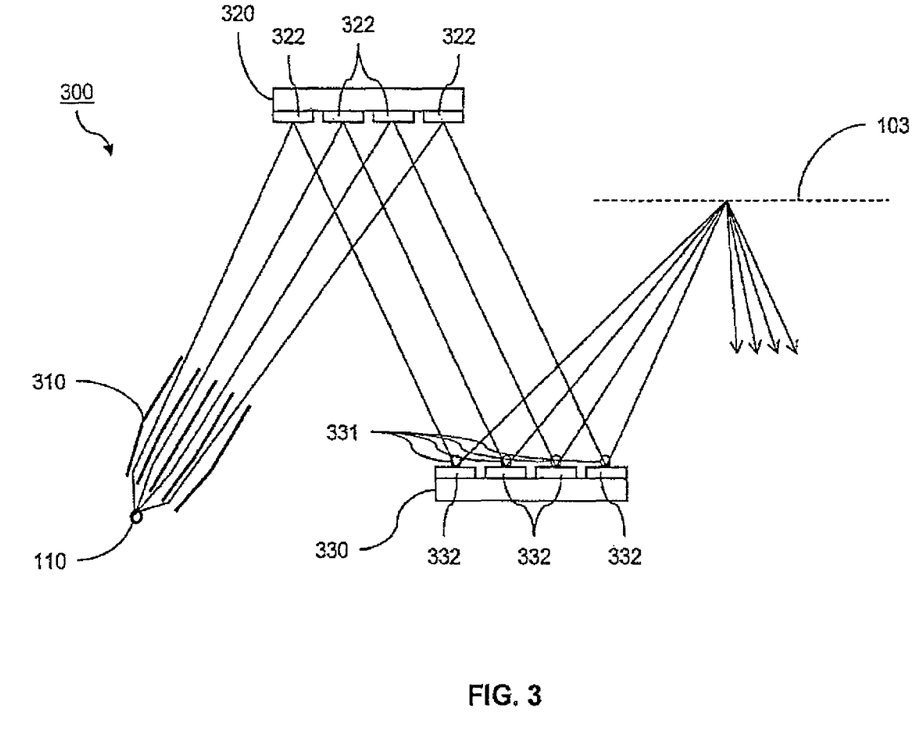
FIG. 3 is a schematic diagram of an illumination system having a field raster plate and a pupil raster plate.

An example of a catoptric illumination system 300 is shown schematically in FIG. 3. Illumination system 300 includes a collector 310, a field raster plate 320, and a pupil raster plate 330. Field raster plate 320 is a faceted reflector composed of an array of field raster elements 322. Similarly, Pupil raster plate 330 is a faceted reflector composed of an array of pupil raster elements 332.

Radiation from source 110 is collected by a collector 310, which includes a number of nested grazing incidence mirrors. Collector 310 directs a beam of radiation from source 110 towards field raster plate 320. Although the beam from collector 310 is depicted as a divergent beam in FIG. 3, in general, the beam from collector 310 can be divergent, collimated, or convergent. Field raster elements 322 decompose the beam and direct the radiation to corresponding pupil raster elements 332 of pupil raster plate 330. Pupil raster elements 332 are configured to direct incident radiation from field raster elements 322 to the field at object plane 103 forming an image of each field raster element at the same location of object plane 103. Both pupil raster plate 330 and field raster plate 320 are also designed to achieve the desired pupil fill. For example, field raster elements 322 can be tilted in such a way that an intermediate image 331 of the source lies at or near corresponding pupil raster elements 332.

As discussed below, the shape of the image of each field raster element 322 at object plane 103 is distorted relative to the actual shape of field raster elements 322. Further, the images of field raster elements 322 can be magnified (e.g., by about 1.5×, about 2×, about 2.5×, about 3×). Field raster elements 322 are shaped so that the image of each element at object plane 103 is the same shape as the object field. Further, images of field raster elements 322 overlap with each other thereby providing uniform illumination of the object field at object plane 103.

Depending on the arrangement of the other elements in illumination system 300, field raster elements 322 can have flat or curved reflective surfaces. In embodiments that include field raster elements with curved reflective surfaces, the surfaces can be concave or convex. The curved surfaces can be spherical or aspherical.

The reflective surfaces of each field raster element 322 can be oriented in the same direction or can be tilted relative to other field raster elements.

In some embodiments, field raster plate 320 and pupil raster plate 330 can be arranged to form images of source 110 at each pupil raster element 332. Moreover, pupil raster elements 332 can be arranged in or near the exit pupil of illumination system 300. Pupil raster elements 332 are configured to provide a desired pupil fill of the exit pupil of illumination system 300, which corresponds to the entrance pupil of the projection objective. For example, pupil raster elements 332 can be arranged to provide circular illumination at the pupil, annular illumination, dipole illumination, or quadrupole illumination.

While illumination system 300 includes collector 320 and two additional components (i.e., field raster plate 320 and pupil raster plate 330), in general, catoptric illumination systems can include additional optical components. For example, illumination systems can include one or more additional mirrors (e.g., normal (e.g., angle of incidence 0° to 20°) or grazing (e.g., angle of incidence 70° to 90°) incidence mirrors). In some embodiments, one or more additional mirrors are included to fold the optical path of the light in accordance with spatial constraints imposed by the components of the microlithography tool. As an example, one or more additional mirrors can be included to direct radiation from pupil raster plate 330 to reticle 140, e.g., where a folded optical path is needed to illuminate the reticle with the desired angle of incidence. For example, one or more mirrors can be included to provide a telescope so that the radiation has a desired divergence at object plate 103 (e.g., to provide divergent or convergent radiation at the reticle). As another example, in some embodiments, one or more mirrors can be positioned between collector 310 and field raster plate 320.

Moreover, while illumination system 300 includes images 331 of light source 110 at each pupil raster element 332, in some embodiments illumination systems can be configured to provide additional images of the source. For example, in certain embodiments, illumination system 300 can include additional mirrors arranged to form an image of light source 110 between collector 310 and field raster plate 320. Such configurations may be advantageous, for example, where light source 110 and collector 310 are provided in a difference module than field raster plate 320 and pupil raster plate 330. In some embodiments, collector 310 can include optics that produce a convergent light beam, forming an image between collector 310 and field raster plate 320, for example.

Illumination systems can include additional components other than mirrors. For example, in certain embodiments, illumination system 300 includes one or more stops which reduce stray radiation from reaching object plane 103. In some embodiments, illumination system 300 can include a spectral purity filter (e.g., a spectral purity filter as described in EP 1540423), a uniformity correction element (e.g., a uniformity correction element as described in EP 1291721), one or more aperture stops (e.g., for selecting an illumination setting to provide a desired pupil fill) (e.g., stops as described in U.S. 2005/0110972). One or more components can be coupled to a manipulator (e.g., a electromechanical manipulator, such as a piezoelectric manipulator) configured to adjust the position of the component during use.

Examples of catoptric illumination systems with field raster plates are described in U.S. Pat. No. 6,438,199 B1 and U.S. Pat. No. 6,859,328 B2, the entire contents both of which are incorporated herein by reference.

Figure 4A:
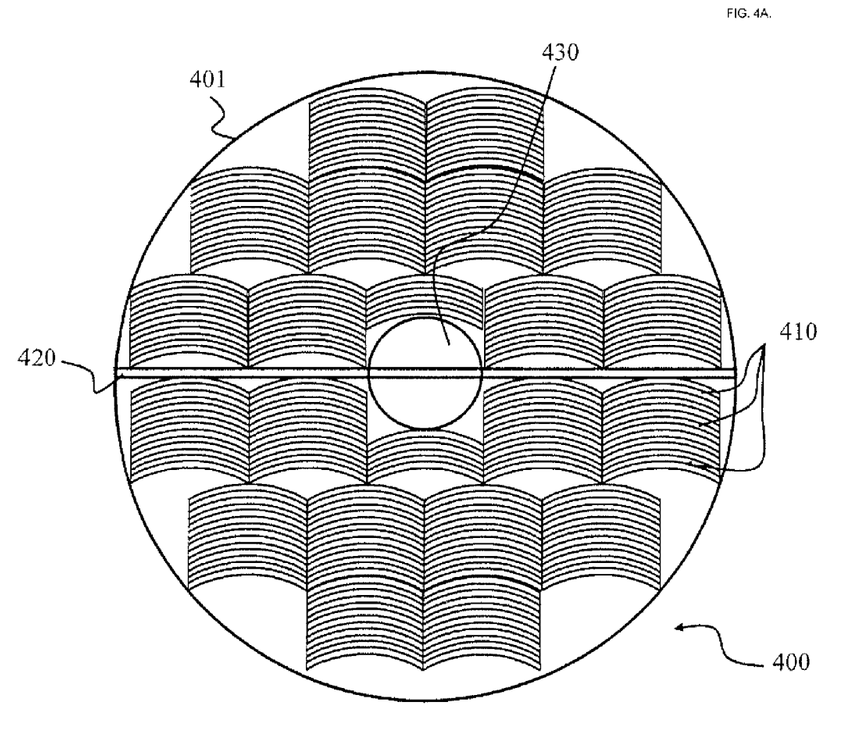
FIG. 4A is a plan view of a field raster plate.

In general, the size and shape of field raster elements 322 are selected so that the size and shape of their images at object plane 103 are the same as object field. Referring to FIG. 4A, in some embodiments, a field raster plate 400 includes an array of arc-shaped (e.g., segment of an annulus) field raster elements 410 arranged to substantially fill an area 401 corresponding to the beam shape from the collector at the field raster plate.

In general, the shape of each field raster element 410 can be the same or different as other field raster elements in plate 400. Field raster elements 410 can be arranged based on various considerations of the illumination system. For example, field raster elements 410 can be arranged based on variations in the illumination profile provided by the collector. Gaps 420 and 430 between field raster elements 410 correspond to shadows in the illumination profile of the beam from structural elements in the collector, for example.

Figure 4B:
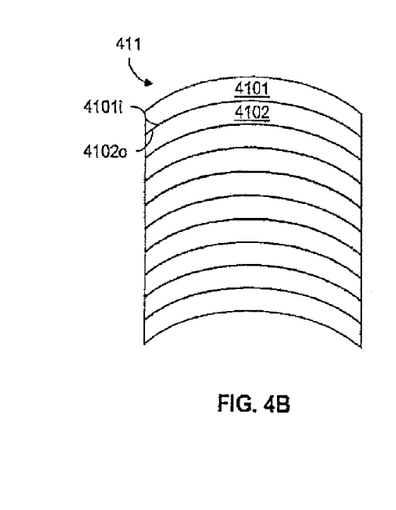
FIG. 4B is a plan view of a group of field raster elements.

Referring to FIG. 4B, field raster elements 410, including elements 4101 and 4102, can be arranged in a group 411 with little or no gap between adjacent field raster plates. For example, where the inner edge 4101$i$ of field raster element 4101 is the same shape as the outer edge 4102$o$ of adjacent field raster plate 4102, they can be stacked in a group with no gap between them.

Grouping the field raster elements with no gaps between adjacent elements can provide greater fill of area 401 relative to groupings that include gaps. Accordingly, grouping field raster elements with no gaps can provide greater transmission efficiency of the illumination system as a larger proportion of the radiation filling area 401 is reflected by the field raster elements.

At least some of field raster elements 410 (e.g., all the field raster elements) have a different shape from that of the object field at object plane 103. Generally, the shape differences are introduced to correct for projection effects that distort the shape of the image of field raster elements from the shape of the object field at the object plane. These projection effects can arise in a catoptric illumination system because the optical system cannot be realized having a common optical axis. Relative tilting between the field raster elements and the object plane can also introduce projection effects that distort the shape of the field from the field raster elements at the object plane. Accordingly, the shape of at least some of field raster elements 410 are distorted relative to the shape of the object field at the object plane. In some embodiments, at least some of field raster elements 410 are distorted relative to the shape of the object field at the object plane such that the distortion of the image of each raster field element at object plane causes the image of those elements to have the same size and shape as the object field. In certain embodiments, the shape of the field raster elements are distorted relative to the shape of the object field such that the overlay of the field raster element images of all field raster elements has the same shape as the object field. Further, as discussed previously, the shape of the field raster elements can be distorted relative to the shape of the object field such that the overlay of the field raster element images of all field raster elements has a desired intensity profile at the object field.

In general, the number of field raster elements in a field raster plate varies as desired based on the specific design of the illumination system. In some embodiments, a field raster plate includes about 100 or more (e.g., about 200 or more, about 280 or more, about 350 or more, about 500 or more) field raster elements.

Figure 5A:
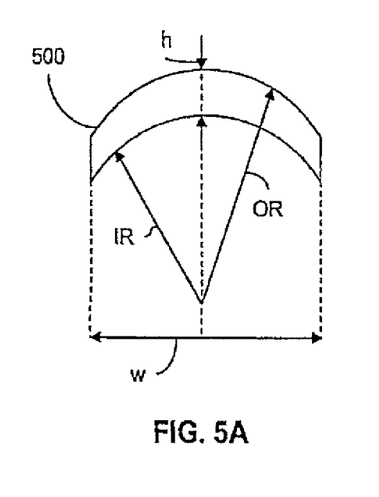
FIG. 5A-5D are plan views of embodiments of field raster elements.

Referring to FIG. 5A, in some embodiments, the field raster plate includes an arc-shaped field raster element 500 which corresponds to a segment of an annulus which is characterized by an inner radius of curvature, IR, an outer radius of curvature, OR, and a width, w. Field raster element 500 is also characterized by a height, h, which is the difference between OR and IR. IR and OR are constant across the width of the raster element. In general, the shape of field raster element 500 is different from the shape of the object field at object plane 103. Where the object field is also in the shape of an annular segment (see FIG. 2), the proportions of the field raster element and the object field differ.

For example, the ratio of IR/w of field raster element 500 can be different from the ratio $IR_f/w_f$ of the object field at the object plane. In some embodiments, IR/w<$IR_f/w_f$ (e.g., $IR_f/w_f$ is about 1.05 IR/w or more, about 1.10 IR/w or more, about 1.15 IR/w or more, about 1.20 IR/w or more, about 1.25 IR/w or more). Alternatively, in certain embodiments, IR/w>$IR_f/w_f$ (e.g., $IR_f/w_f$ is about 0.95 IR/w or less, about 0.90 IR/w or less, about 0.85 IR/w or less, about 0.80 IR/w or less).

Alternatively, or additionally, the ratio of h/w of field raster element 500 can be different from the ratio $h_f/w_f$ of the object field at the object plane. In some embodiments, h/w<$h_f/w_f$ (e.g., $h_f/w_f$ is about 1.05 h/w or more, about 1.10 h/w or more, about 1.15 h/w or more, about 1.20 h/w or more, about 1.25 h/w or more). Alternatively, in certain embodiments, h/w>$h_f/w_f$ (e.g., $h_f/w_f$ is about 0.95 h/w or less, about 0.90 h/w or less, about 0.85 h/w or less, about 0.80 h/w or less).

In some embodiments, the ratio of IR/h of field raster element 500 is different from the ratio $IR_f/h_f$ of the object field at the object plane. For example, in certain embodiments, IR/h<$IR_f/h_f$ (e.g., $IR_f/h_f$ is about 1.05 IR/h or more, about 1.10 IR/h or more, about 1.15 IR/h or more, about 1.20 IR/h or more, about 1.25 IR/h or more). Alternatively, in some embodiments, IR/h>$IR_f/h_f$ (e.g., $IR_f/h_f$ is about 0.95 IR/h or less, about 0.90 IR/h or less, about 0.85 IR/h or less, about 0.80 IR/h or less).

In general, the size of the field raster elements can vary compared to the size of the object field. Typically, the size of the field raster elements depends on the desired size of the object field and the magnification of the illumination system. In some embodiments, the size of the field raster elements is smaller than the object field and the image of the field raster elements is magnified. For example, the image of the field raster elements can be magnified by about 1.5× or more (e.g., about 2× or more, about 4× or more, about 8× or more).

In some embodiments, the field raster elements have a width of about 10 mm or more (e.g., about 14 mm or more, about 20 mm or more, about 30 mm or more, about 45 mm or more, about 57 mm or more, about 73 mm or more). In certain embodiments, the field raster elements have a height, h, of about 0.5 mm or more (e.g., about 1 mm or more, about 1.6 mm or more, about 2.5 mm or more, about 3.2 mm or more, about 4.2 mm or more, about 6.1 mm or more).

As discussed, in general, for each field raster element IR and OR can be the same or different. In some embodiments, IR and/or OR are about 10 mm or more (e.g., about 15 mm or more, about 20 mm or more, about 32 mm or more, about 38 mm or more, about 46 mm or more, about, 56 mm or more, about 70 mm or more).

As an example, in certain embodiments, the field raster elements have a width of about 14 mm, a height of about 1 mm, and an IR that is approximately the same as OR, which is about 15 mm.

The shape of each raster element can be determined using optical design principles, which can be implemented using optical design software, such as commercially-available optical design software (e.g., Code V from ORA, Pasadena, Calif.). For example, where the general design of the illumination system is already known, optical design principles can be used to find an optimal shape for the field raster elements based on the object field shape using one or more dimensions of the field raster elements as a fitting parameter. Exemplary fitting parameters for annular segment shaped elements include the ratios IR/w, h/w, IR/h and their inverses. The value of the corresponding parameter of the object field shape can be used as starting value for an optimization algorithm, which is then varied until an optimal value for the parameter is found. One approach is to trace rays backward from the object field through the illumination system onto the field facets. The border of the ray positions on each field facet gives the optimal shape of that facet. In embodiments where the shape of more than one field raster element is the same (e.g., all have the same shape), all border lines can be fitted by the same curve using, for example, a least square fit. As an example, the inner and/or outer radius of curvature of each field raster element can be determined a least square fit.

In general, more than one fitting parameter can be used to determine the shape of each field raster element.

Figure 5B:
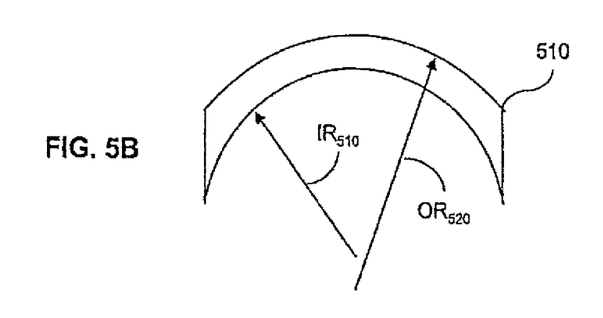

While field raster elements having annular segment shapes have been described, other arc-shaped field raster elements are also contemplated. For example, referring to FIG. 5B, in some embodiments, the radius of curvature of the inner edge, $IR_{510}$, of a field raster element, 510, can be different from the radius of curvature of the outer edge, $OR_{510}$. The ratios $IR_{510}/OR_{510}$ or $OR_{510}/IR_{510}$ can be used as a fitting parameter for determining an optimal field raster element shape. In some embodiments, $IR_{510} > OR_{510}$. Alternatively, in certain embodiments, $OR_{510} > IR_{510}$.

Figure 5C:
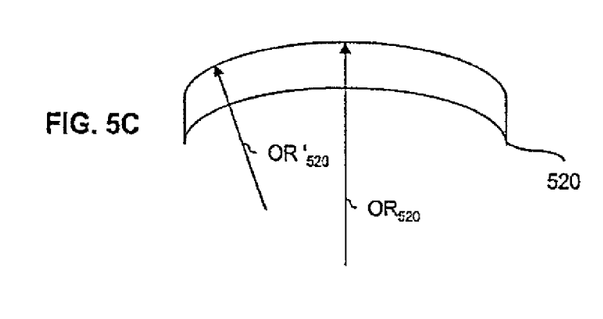

In some embodiments, the inner and/or outer edge of one or more field raster elements can deviate from a circular shape. In other words, arc-shaped field raster elements that are not annular segments are also possible. In some embodiments, the inner and/or outer edge of one or more field raster elements can have a radius of curvature that varies along the width of the element. As an example, and with reference to FIG. 5C, in some embodiments, a field raster element 520 has an outer radius that varies along width of the field raster element. By way of example, the outer radius, $OR_{520}$, at a symmetry plane of field raster element 520 is larger than an outer radius $OR'_{520}$ closer to the edge of the field raster element. For field raster element 520, the shape of the inner edge is the same as the shape of the outer edge.

Figure 5D:
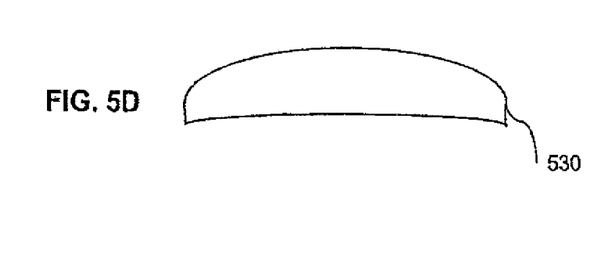

A further example is field raster element 530 shown in FIG. 5D, where both the inner edge and outer edge have a radius of curvature that varies along the width of the element. Here, however, the shape of the inner edge is different from the shape of outer edge.

Furthermore, while exemplary field raster elements 500, 510, 520, and 530 all have a symmetry plane, asymmetric field raster elements can also be used.

In some embodiments, polynomial functions can be used to determine the optimal shape for field raster elements. For example, polynomial coefficients can be used as fitting parameters in an optimization algorithm to determine an optimal element shape. Accordingly, the inner and/or outer edge of a raster field element can correspond to a polynomial function (e.g., a quadratic or higher order fitting function).

Furthermore, while principles are disclosed for determining the shape of field raster elements for an object field shaped as a segment of an annulus, these principles can be applied for other object field shapes, such as rectangular object fields, circular object fields, and/or elliptical object fields.

A number of embodiments have been described. Other embodiments are in the following claims.

What is claimed is:

1. A system, comprising:
   an illumination system configured to be used in a microlithography tool, the illumination system comprising a field raster plate comprising a plurality of reflective elements,
   wherein, during operation of the system, the plurality of reflective elements of the field raster plate direct radiation from a source along an optical path to an object field at an object plane of a projection objective of the microlithography tool, and wherein:
   the image of each of the plurality of elements of the field raster plate partially overlaps at the object field such that the images fill the object field;
   the plurality of reflective elements comprises a subset of the reflective elements;
   for each reflective element of the subset of reflective elements, the reflective element has a height extending along a first dimension and a width extending along a second dimension which is perpendicular to the first dimension; and
   for at least one of the subset of reflective elements, its height varies along the second direction.

2. The system of claim 1, wherein the illumination system is configured to image each of the plurality of reflective elements of the field raster plate to the object plane of the projection objective.

3. The system of claim 1, further comprising a second component configured to direct illumination reflected from the plurality of reflective elements of the field raster plate along the optical path to the object plane of the projection objective.

4. The system of claim 1, wherein the illumination system is a catoptric illumination system.

5. The system of claim 1, each of the plurality of reflective elements of the field raster plate has a spherical reflective surface.

6. A tool, comprising:
   an illumination system according to claim 1; and
   a projection objective,
   wherein the tool is a microlithography tool.

7. The system of claim 1, wherein a height of two or more of the plurality of the subset of reflective elements of the field raster plate varies along a direction perpendicular to the height.

8. The system of claim 1, wherein at least some of the plurality of reflective elements of the field raster plate have different shapes.

9. The system of claim 8, wherein the different shapes are introduced to correct for effects that distort a shape of an image of the plurality of reflective elements of the field raster plate.

10. The system of claim 1, wherein each of the plurality of reflective elements of the field raster plate has the same shape.

11. The system of claim 1, wherein the field raster plate further comprises a second plurality of reflective elements, each of the second plurality of reflective elements has the same shape and a height that does not vary along a direction perpendicular to the height.

12. The system of claim 1, wherein a shape of each of the plurality of elements of the field raster plate is selected so that an energy profile of the radiation at the object field has a substantially Gaussian or trapezoidal shape along at least one direction.

13. The system of claim 1, wherein all of the plurality of reflective elements of the field raster plate have a curved shape that is different from the shape of the object field.

14. The system of claim 1, wherein at least one pair of the plurality of reflective elements of the field raster plate has adjacent edges that have the same shape.

15. The system of claim 1, wherein the at least one reflective element has an outer radius that varies along the second direction.

16. The system of claim 15, wherein the at least one reflective element has an inner radius that varies along the second direction.

17. The system of claim 1, wherein the at least one reflective element has an inner radius that varies along the second direction.

18. The system of claim 1, each reflective element of the subset of reflective elements has the same width.

19. An illumination system, comprising:
a field raster plate comprising a plurality of reflective elements configured so that, during operation of the system, the plurality of reflective elements direct radiation from a source along an optical path to an object field where a reticle is locatable such that an image of each of the plurality of reflective elements partially overlaps at the object field such that the images fill the object field,
wherein:
   each reflective element comprises a reflective surface;
   the plurality of reflective elements comprises a subset of the reflective elements;
   for each reflective element of the subset of reflective elements, a total length of its reflective surface extends in a first dimension and a total width of its reflective surface extends in a second dimension which is perpendicular to the first dimension; and
   for at least one reflective element of the subset of reflective elements, its total length is different from the total length of the reflective surface of some of the other reflective elements of the subset of reflective elements.

20. The illumination system of claim 19, wherein the reflective surface of each reflective element of the subset of reflective elements has the same total width.

21. An illumination system, comprising:
a field raster plate comprising a plurality of reflective elements configured so that, during operation of the system, the plurality of reflective elements direct radiation from a source along an optical path to an object field where a reticle is located such that an image of each of the plurality of reflective elements partially overlaps at the object field such that the images fill the object field,
wherein:
   the plurality of reflective elements comprises a subset of the reflective elements;
   for each reflective element of the subset of reflective elements:
      the reflective element has:
         a first edge;
         a second edge opposite the first edge;
         a third edge extending between the first and second edges; and
         a fourth edge extending between the first and second edges, the fourth edge being opposite the third edge;
      a height of the reflective element extends from the third edge to the fourth edge; and
      a width of the reflective elements extends from the first edge to the second edge; and
   for at least one reflective element of the subset of reflective elements, its height varies along a direction perpendicular of its width.

22. The system of claim 21, wherein the at least one reflective element has an outer radius that varies along the second direction.

23. The system of claim 22, wherein the at least one reflective element has an inner radius that varies along the second direction.

24. The system of claim 21, wherein the at least one reflective element has an inner radius that varies along the second direction.

25. The system of claim 21, wherein each reflective element of the subset of reflective elements has the same width.

* * * * *

UNITED STATES PATENT AND TRADEMARK OFFICE
CERTIFICATE OF CORRECTION

PATENT NO. : 9,588,434 B2  
APPLICATION NO. : 13/562515  
DATED : March 7, 2017  
INVENTOR(S) : Jens Ossmann et al.

It is certified that error appears in the above-identified patent and that said Letters Patent is hereby corrected as shown below:

In the Specification

Column 3, Line 46, delete "quadrapole" and insert -- quadrupole --.

Column 5, Line 41, after "In embodiments", insert -- $\lambda$ --.

Signed and Sealed this  
Twenty-fifth Day of July, 2017

Joseph Matal  
*Performing the Functions and Duties of the*  
*Under Secretary of Commerce for Intellectual Property and*  
*Director of the United States Patent and Trademark Office*